United States Patent [19]

Nickol

[11] Patent Number: 4,559,534
[45] Date of Patent: Dec. 17, 1985

[54] DISPLAY DEVICE WITH LEGENDS FORMED INTEGRALLY WITH ELECTRODE STRUCTURE

[75] Inventor: Friedrich-Wilhelm Nickol, Eppstein, Fed. Rep. of Germany

[73] Assignee: VDO Adolf Schindling AG, Frankfurt am Main, Fed. Rep. of Germany

[21] Appl. No.: 424,657

[22] Filed: Sep. 27, 1982

[30] Foreign Application Priority Data

Oct. 23, 1981 [DE] Fed. Rep. of Germany ....... 3142101

[51] Int. Cl.⁴ ............................................. G09G 3/18
[52] U.S. Cl. ..................................... 340/754; 340/784
[58] Field of Search ............... 340/753, 754, 763, 765, 340/784

[56] References Cited

U.S. PATENT DOCUMENTS

| | | | |
|---|---|---|---|
| 3,727,527 | 1/1973 | Borowski et al. | 340/765 |
| 4,023,890 | 5/1977 | Shirasu et al. | 340/765 |
| 4,178,593 | 12/1979 | Kishino et al. | 340/753 |
| 4,217,578 | 8/1980 | Inami et al. | 340/754 |
| 4,242,980 | 1/1981 | Go | 340/753 |
| 4,247,855 | 1/1981 | Uede et al. | 340/753 |
| 4,277,786 | 7/1981 | Waldron | 340/765 |
| 4,306,233 | 12/1981 | Westbrook | 340/753 |

*Primary Examiner*—Marshall M. Curtis
*Attorney, Agent, or Firm*—Martin A. Farber

[57] ABSTRACT

A display device having a cell containing a liquid-crystal substance arranged between two opposing electrodes (3, 4, 5, 6). One of the opposing electrodes is subdivided into a plurality of selectively activatable adjacent display electrodes (4, 5, 6) forming bar graphs (9, 10, 11) while the other electrode is arranged opposite the display electrodes (4, 5, 6) as a common electrode (3). In order to permit simultaneous display of two items of information while maintaining a simple construction, one of the electrodes (3, 4, 5, 6) has recesses (8) which form a display pattern.

9 Claims, 3 Drawing Figures

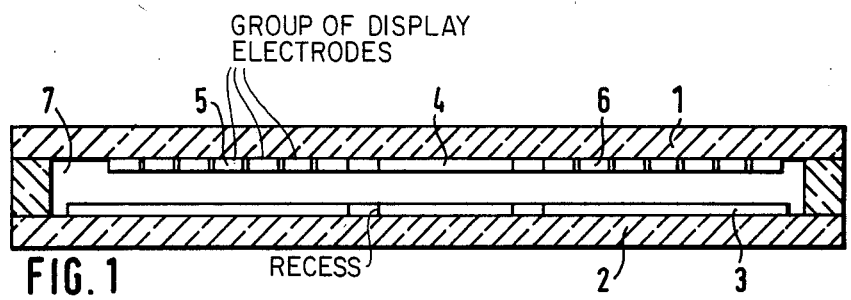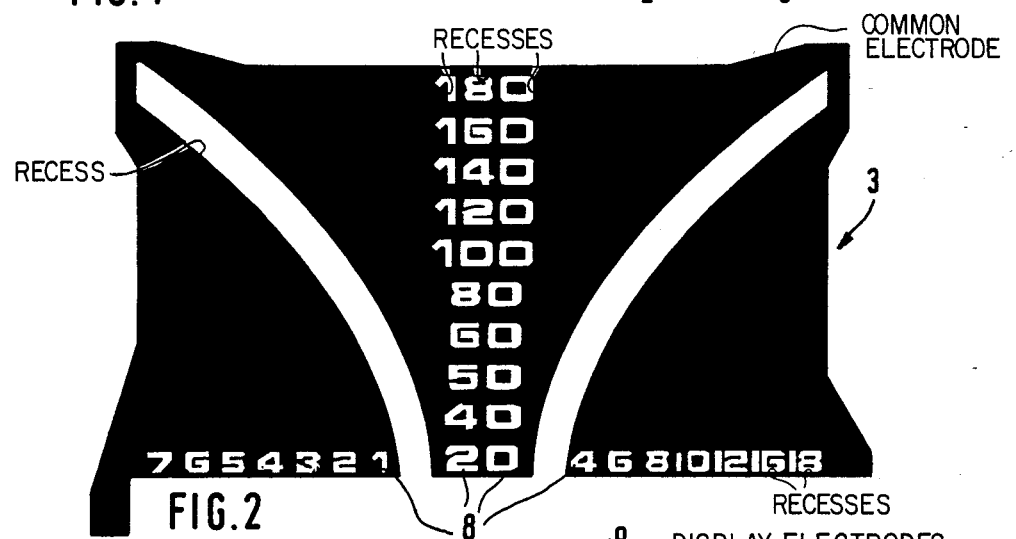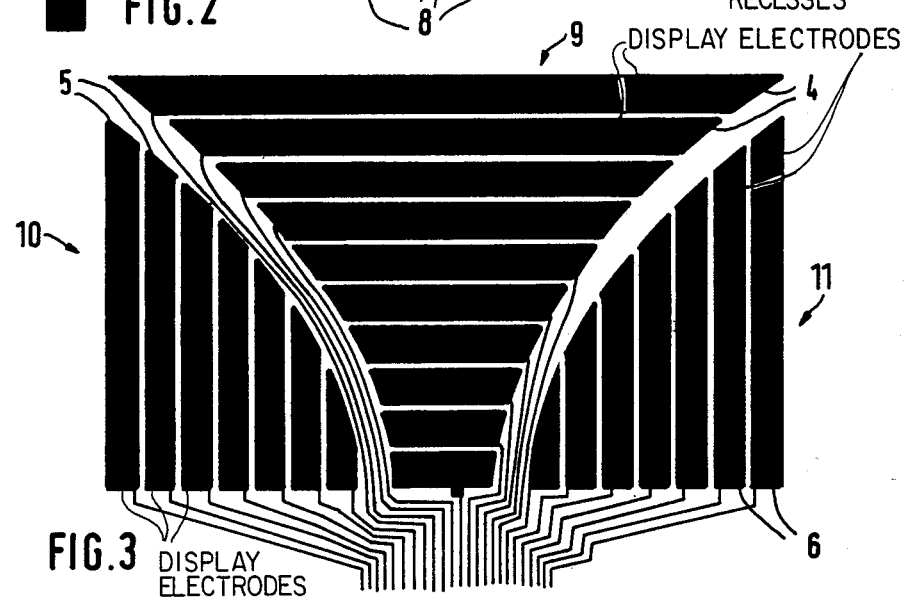

DISPLAY DEVICE WITH LEGENDS FORMED INTEGRALLY WITH ELECTRODE STRUCTURE

The present invention refers to a display device having a cell in which a liquid-crystal substance is arranged between two opposing electrodes. One of the opposing electrodes is subdivided into a plurality of selectively activatable adjacent display electrodes forming bar graphs, and the other electrode is arranged as a common electrode opposite the display electrodes.

In such display devices it is known, in order to represent fixed display patterns such as, for instance, scale legends, to produce the patterns by a color imprint on one of the cell walls. In this way it is possible to present both fixed and variable items of information. Such a color imprint, however, requires a separate operation for its manufacture, so that this method is cumbersome and expensive.

The object of the present invention is therefore to create a display device in accordance with the introductory paragraph which, while it is of simple construction, makes it possible to display simultaneously two items of information.

This object is achieved in accordance with the invention in the manner that one of the electrodes (3, 4, 5, 6) has recesses (8) which form a display pattern. In this manner a first item of information is supplied, without having to apply a separate layer in the cell, by activating the display electrodes while the second item of information is determined by the display pattern which is simultaneously presented. In this connection the fixed display patterns may be alphanumeric characters. Upon the activation of the individual display electrodes the corresponding character, for instance a numerical value, is thus displayed in each case.

The common electrode (3) is preferably the electrode which is further from the observer.

One display pattern can be associated with one display electrode or else one common display pattern can be associated with a plurality of display electrodes (4, 5, 6). In the former case, upon the activating of a display electrode, the corresponding display pattern appears complete, while in the second case, in which the recesses are developed preferably in the common electrode, the display pattern, in case of merely partial activation of the corresponding display electrodes, is also only partially visible. Growth of the display pattern can thus be obtained with growth of the activated display electrodes.

A common electrode (3) can be arranged opposite several groups of display electrodes (4, 5, 6) which form bar graphs (9, 10, 11). If the display is arranged in the instrument panel of an automative vehicle, then it is possible in this manner to have, for instance, a speed display, an rpm display, as well as a display of the instantaneous fuel consumption. If none of the display electrodes is actuated, the entire display field is, for instance, dark. Upon actuation of the display electrodes the display fields formed by them as well as the corresponding characters become visible. By the bar graph there is thus displayed an analog presentation while by the display pattern which is simultaneously presented, for instance, as a number, information is displayed digitally.

A preferred embodiment, described in further detail below, is shown in the drawing, in which:

FIG. 1 is a cross section through a display device in accordance with the invention;

FIG. 2 is the common electrode of the display device of FIG. 1; and

FIG. 3 shows the display electrodes of the display device of FIG. 1.

The display device shown in the figures consists of a cell which is formed of two cell walls 1 and 2 spaced from each other. The rear cell wall 2 bears a common electrode 3.

The bar graphs 9, 10 and 11 formed by selectively actuatable display electrodes 4, 5 and 6 are arranged on the front cell wall 1. The recesses 8 are locations in the area of the selectively activatable electrodes which are free of electrode material.

Each display electrode 4, 5 and 6 has its own connection. The cell chamber is filled with a liquid-crystal substance.

Number-forming recesses 8 are present in the common electrode 3 opposite the individual display electrodes 4, 5 and 6.

The entire display device is installed in the instrument panel (not shown) of an automative vehicle, the bar graph 9 being a speed indication, the bar graph 10 an rpm indication and the bar graph 11 an indication of the instantaneous consumption of fuel.

If in the case of the bar graph 9, the bottom three display electrodes 4 are activated, then three corresponding display fields become visible to an observer and thus show the speed in analog fashion while at the same time the corresponding numerical value appears digitally in the display field. No other display field or numerical value then appears.

The bar graphs 10 and 11 operate in the same manner.

While I have disclosed one embodiment of my invention, it is to be understood that this embodiment is given by example only and not in a limiting sense.

I claim:

1. In a display device, a cell comprising:
   an electrode assembly consisting of only two opposed electrode structures,
   a liquid-crystal substance arranged between said two opposed electrode structures,
   a first of said electrode structures being divided into a plurality of selectively activatable adjacent display electrodes arranged to form bar graphs while the other of said electrode structures is formed as a common electrode, and is positioned opposite said display electrodes as a common electrode, and wherein
   one of said opposed electrodes structures has recesses which form a fixed display pattern, each of said recesses being formed directly within an electrode of one of said electrode structures, individual ones of said recesses being in registration with corresponding ones of said display electrodes such that a symbol provided by a recess appears to an observer to be within a corresponding display electrode image upon activation of the corresponding display electrode.

2. The display device according to claim 1, wherein the display pattern is fixed and includes alphanumeric characters.

3. The display device according to claim 1, wherein said common electrode is positioned further from an observer than said display electrodes.

4. The display device according to claim 1, 2, or 3, wherein said display pattern is associated with a group of said display electrodes.

5. The display device according to claim 1, 2, or 3, wherein
a plurality of said display electrodes provide a common display pattern.

6. The display device according to claim 1, 2, or 3, wherein
said common electrode is positioned opposite a plurality of groups of said display electrodes for the formation of said bar graphs.

7. The display device according to claim 1, 2, or 3, wherein
said display is adapted for inclusion in the instrument panel of an automotive vehicle.

8. A liquid crystal display comprising:
a common electrode,
a plurality of sets of bar-shaped electrodes positioned in front of said common electrode, and liquid crystal material provided between said bar-shaped electrodes and said common electrode,
individual ones of said sets being spaced apart to permit simultaneous presentation of separate bar graph displays, and wherein
individual ones of said bar-shaped electrodes are provided with recesses in the form of symbols for a simultaneous presentation of a character display with a bar graph display, a symbol provided by a recess appearing to an observer to be within a bar-shaped electrode image upon activation of the corresponding bar-shaped electrode.

9. The display device according to claim 1, wherein said recesses are formed within said common electrode.

* * * * *